(12) United States Patent
Kim et al.

(10) Patent No.: US 7,328,504 B2
(45) Date of Patent: Feb. 12, 2008

(54) METHOD FOR MANUFACTURING CIRCUIT BOARD WITH BUILT-IN ELECTRONIC COMPONENTS

(75) Inventors: Seung Gu Kim, Chungcheongbuk-do (KR); Chang Sup Ryu, Daejeon (KR); Han Seo Cho, Daejeon (KR); Doo Hwan Lee, Gyeonggi-do (KR); Hwa Sun Park, Seoul (KR)

(73) Assignee: Samsung Electro-Mechanics Co., Ltd, Kyunggi-Do (KR)

( * ) Notice: Subject to any disclaimer, the term of this patent is extended or adjusted under 35 U.S.C. 154(b) by 107 days.

(21) Appl. No.: 11/453,790

(22) Filed: Jun. 15, 2006

(65) Prior Publication Data

US 2007/0006456 A1    Jan. 11, 2007

(30) Foreign Application Priority Data

Jul. 7, 2005    (KR) .................... 10-2005-0061370

(51) Int. Cl.
*H05K 3/30* (2006.01)
*H05K 3/34* (2006.01)
*H01K 3/10* (2006.01)

(52) U.S. Cl. ............................. 29/832; 29/840; 29/852
(58) Field of Classification Search ................. 29/832, 29/840, 852
See application file for complete search history.

(56) References Cited

U.S. PATENT DOCUMENTS

| | | | |
|---|---|---|---|
| 3,614,832 A * | 10/1971 | Chance et al. ................ 29/831 |
| 4,829,666 A * | 5/1989 | Haghiri-Tehrani et al. .... 29/841 |
| 4,835,846 A * | 6/1989 | Juan et al. ..................... 29/840 |
| 4,897,534 A * | 1/1990 | Haghiri-Tehrani .......... 235/488 |
| 4,918,811 A * | 4/1990 | Eichelberger et al. ...... 438/107 |
| 4,941,257 A * | 7/1990 | Gloton ......................... 29/840 |
| 5,055,913 A * | 10/1991 | Haghiri-Tehrani .......... 257/676 |
| 5,452,182 A * | 9/1995 | Eichelberger et al. ...... 361/749 |
| RE35,385 E * | 12/1996 | Gloton ......................... 29/840 |
| RE35,578 E * | 8/1997 | Gloton et al. ................. 29/840 |

FOREIGN PATENT DOCUMENTS

JP    2002-246757    8/2002

* cited by examiner

*Primary Examiner*—C. J. Arbes
(74) *Attorney, Agent, or Firm*—Gottlieb, Rackman & Reisman, P.C.

(57) ABSTRACT

Disclosed is a method for manufacturing a circuit board, comprising step for preparing an insulating member and an electronic component having position-setting means on the lower surface thereof (S110), step for forming mounting holes in the insulating member (S120), step for mounting the electronic component on the insulating member to meet the position-setting means and the mounting holes (S130), step for forming copper cladding coated with an adhesive on the insulating member (S140), step for applying heat and/or pressure to the copper cladding (S150), and step for forming a via-hole in the copper cladding to be electrically connected to the electronic component, and step for forming a circuit pattern in the copper cladding (S160). The step (S150) can comprise a step (S240) for applying inter-adhesive on respective surfaces of the insulating member, and a step (S250) for applying copper cladding on respective surfaces of the inter-adhesive.

7 Claims, 7 Drawing Sheets

METHOD FOR MANUFACTURING CIRCUIT BOARD WITH BUILT-IN ELECTRONIC COMPONENTS

BACKGROUND OF THE INVENTION

1. Field of the Invention

The present invention relates to a method for manufacturing a circuit board. More particularly, the present invention relates to a method for manufacturing a circuit board having built-in electronic components, capable of ensuring high reliability.

2. Background of the Related Art

A circuit board is a part for electronic apparatuses and serves as a base plate for mounting electronic components thereon. Further, the circuit board electrically connects electronic components mounted thereon to each other, and holds the electronic components. Recently, circuit boards are becoming more important parts because electronic apparatuses using the circuit boards are becoming more complex. In order to respond to this trend, that is, in order to increase the degree of integration of electronic components in a circuit board, a multi-layered circuit board, in which a plurality of circuit boards are stacked, and an integrated circuit board, in which electronic components are built in, have been developed.

Currently, a plurality of methods of mounting electronic components on a circuit board is disclosed, and one example thereof is disclosed in Japanese Patent Laid-Open Publication number 2002-246757, entitled "Method of Manufacturing Multi-layered Printed Circuit Board." For reference, the example is described hereinafter with reference to FIGS. 6A to 6E.

First, referring to FIG. 6A, a core substrate 30 having a through hole 32 is prepared. The lower part 32a of the through hole 32 is tapered. That is, the tapered portion of the through hole 32 becomes larger toward its lower end.

Next, referring to FIG. 6B, ultraviolet tape (UV-tape) 40 is attached to the lower surface of the core substrate 30 to close the lower end of the through hole 32.

Next, referring to FIG. 6C, a chip 20 is installed in the through hole 32 on the UV-tape 40 in a manner such that die pads 38 of the chip 20 are adhered onto the upper surface of the UV tape 40.

Next, referring to FIG. 6D, the hole 32 is filled with a filler 41, and air in the filler 41 is removed by decompressing the hole 32.

Finally, referring to FIG. 6E, the core substrate 30 is pressurized and/or heated in the vertical direction by stainless press plates 100A and 100B.

The conventional method has disadvantages in that the chip 20 is difficult to mount on a desired position on the UV-tape 40 because the chip 20 is fixed in the core substrate 30 in a manner such that the chip 20 is weakly adhered on the UV-tape 40 and is then securely fixed when the filter 40 is cured using the press. That is, even if the chip 20 is mounted on the desired position when attaching the chip 20 on the UV-tape 40, the chip 20 can be moved or detached from the UV-tape 40, thereby being displaced from its desired mounting position when the hole 32 is filled with the filler 41. Accordingly, the reliability of the circuit board cannot be guaranteed.

SUMMARY OF THE INVENTION

Accordingly, the present invention has been made keeping in mind the above problems occurring in the related art, and an object of the present invention is to provide a method for manufacturing a circuit board, being capable of realizing highly reliable circuit boards, by providing an electronic component with a position-setting means and providing a substrate with an accommodation means for receiving the position-setting means therein.

In order to achieve the above-described objects and advantages, according to one embodiment of the present invention, there is provided a method of manufacturing a circuit board, comprising (a) preparing an insulating member and an electronic component having a plurality of position-setting means on a lower surface thereof, (b) forming mounting holes corresponding to respective position-setting means in the insulating member, (c) mounting the electronic component on the insulating member to meet the position-setting means and the mounting hole, (d) providing copper cladding coated with an adhesive to respective surfaces of the insulating member to cover the electronic component, (e) applying heat and pressure to the copper cladding, and (f) forming a via hole in the copper cladding to be electrically connected to the electronic component, and forming a circuit pattern in the copper cladding.

In order to achieve the above-described objects and advantages, there is provided a method for manufacturing a circuit board with a built-in electronic component, comprising (a) preparing an insulating member and an electronic component having a position-setting means on a lower surface thereof, (b) forming a mounting hole corresponding to the position-setting means in the insulating member, (c) mounting the electronic component on the insulating member to meet the position-setting means and the mounting hole, (d) providing inter-adhesive on respective surfaces of the insulating member to cover the electronic component, (e) providing copper cladding on respective surfaces of the inter-adhesive, (f) applying heat and/or pressure to the copper cladding, and (g) forming a via hole in the copper cladding to be electrically connected to the electronic component, and forming a circuit pattern in the copper cladding, wherein the inter-adhesive is made of prepreg, or is in a solid phase or a liquid phase.

The insulating member may be made of resin, prepreg or metal core.

The position-setting means may be a metal pad electrically connected to the electronic component, or a protrusion electrically disconnected from the electronic component.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Figure 1:
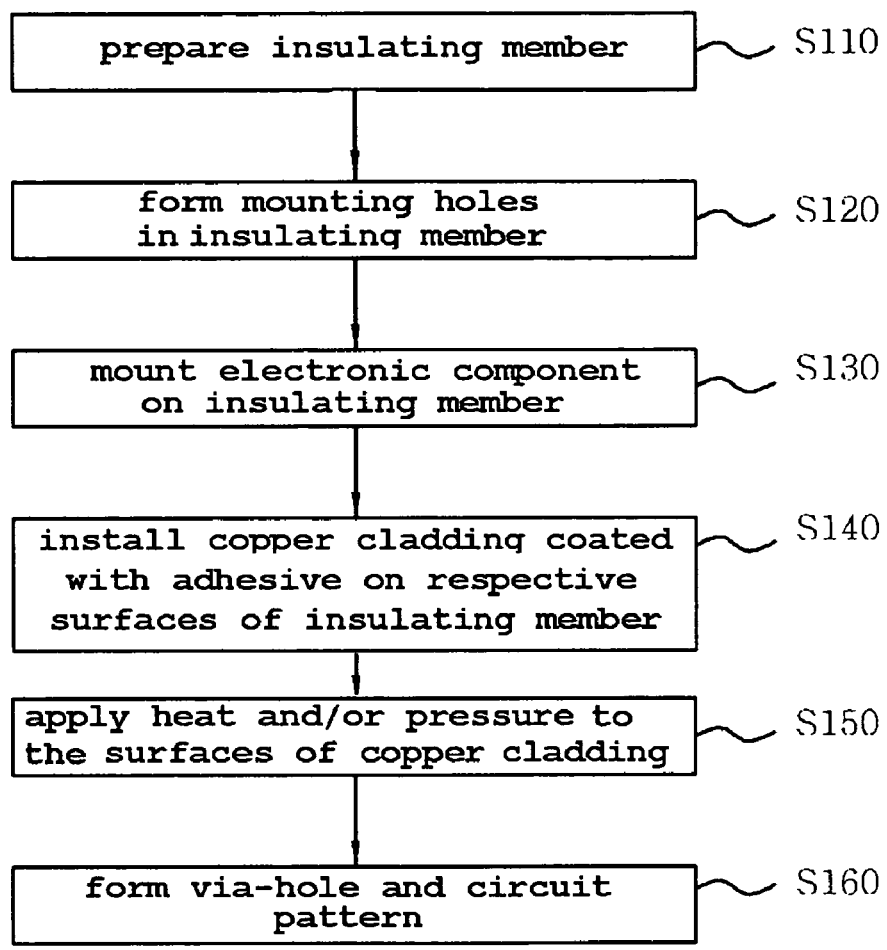
FIG. 1 is a flow chart showing a method for manufacturing a circuit board according to one embodiment of the present invention.

Advantages and features of the present invention and methods of accomplishing the same may be understood more readily with reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention is only to be defined by the appended claims. Like reference numerals refer to like elements throughout the specification.

Now, embodiments of the present invention will be described in more detail with reference to the accompanying drawings.

A method for manufacturing a circuit board, according to one embodiment of the present invention, will be described with reference to FIG. 1 and FIGS. 2A to 2F.

Referring to FIG. 1, the method for manufacturing a circuit board comprises a step (S110) for preparing an insulating member and an electronic component having a position-setting means on the lower surface thereof, a step (S120) for forming a mounting hole in the insulating member, a step (S130) for mounting the electronic component on the insulating member to meet the position-setting means and the mounting hole, a step (S140) for applying copper cladding coated with an adhesive onto respective surfaces of the insulating member, a step (S150) for applying heat and/or pressure to the respective surfaces of the copper cladding, and a step (S160) for forming a via hole in the copper cladding to be electrically connected to the electronic component, and forming a circuit pattern in the copper cladding.

The method will be described in more detail below with reference to FIGS. 2A to 2F.

Figure 2A:
FIGS. 2A to 2F are cross-sectional views sequentially showing the method shown in FIG. 1.

Referring to FIG. 2A, an insulating member 101 is prepared.

Figure 2B:
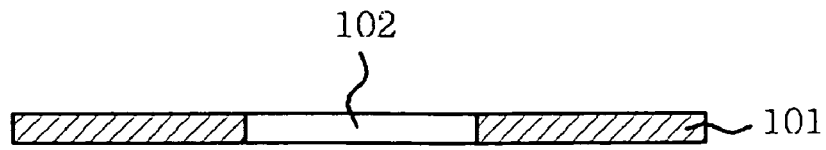

Referring to FIG. 2B, holes 102 having a predetermined size are formed in the insulating member 101. The holes 102 are mounting holes for mounting an electronic component. The mounting holes 102 are formed through a drilling method using a drill such as a numeric control drill (NC drill), wherein the drilling blade used in the drill can be carefully selected such that the holes have a desired size.

The insulating member 101 is made of prepreg, which is a shorthand expression for "pre-impregnated", and is a semi-rigid material prepared by impregnating resin in glass fibers. According to the embodiment of the present invention, the insulating member 101 is made of prepreg, but the material for making the insulating member 101 is not limited thereto. That is, the insulating member can be made of a thermosetting resin or a metal core, in which a metal is embedded in an insulating material.

Figure 2C:
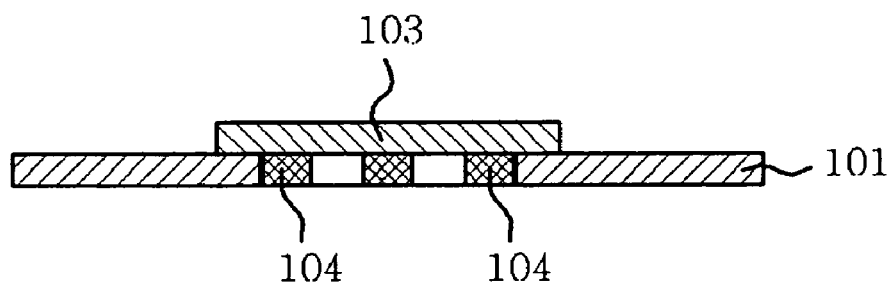

Referring to FIG. 2C, an electronic component 103 is mounted on the insulating member 101 such that pads 104 formed on the lower surface of the electronic component 103 precisely fit in respective mounting holes 102.

The number of the pads 104 serving as a position-setting means is preferably two or more. According to this embodiment, three pads 104 are provided. The pads 104 are formed on the lower surface of the electronic component 103 and are generally made of metal, so that the pads 104 are electrically connected to the electronic component.

The drawings illustrate the case where the electronic component is a single chip, but the electronic component can be a stacked-type chip, in which a plurality of chips is stacked. In the case that the electronic component is a stacked-type chip, an inter-adhesive, which will be described below, is a thick solid phase adhesive or a liquid phase adhesive having high viscosity, in which the adhesive is the same thickness as the electronic component.

Figure 2D:
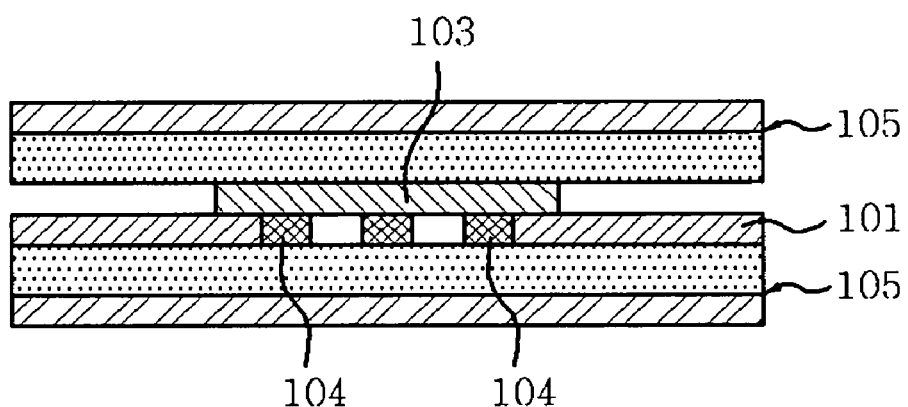

Referring to FIG. 2D, copper cladding 105, having the surface thereof coated with resin, is applied on respective surfaces of the insulating member 101. In this instance, an upper copper cladding 105 installed on the upper surface of the insulating member 101 is installed so as to cover the upper surface of electronic component 103 and a lower copper cladding 105 installed on the lower surface of the insulating member is installed to cover the lower surface of the insulating member 101.

Figure 2E:
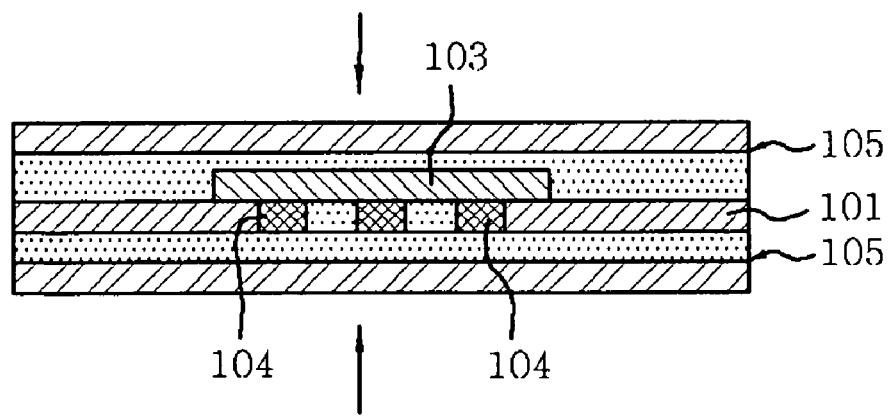

Referring to FIG. 2E, pressure is applied to the upper and lower copper cladding 105 so that the copper claddings 105 are pressed in the direction of arrows using a pressure producing apparatus and heat is then applied to the copper cladding 105 using a heater.

Thanks to the heat and pressure, the copper cladding 105 is securely fixed to the insulating member 101. Here, since the resin coated on the copper cladding 101 prevents pressure from being directly transferred to the electronic component 103, the electronic component 103 is not damaged by the pressure. Further, since the electronic component 103 is mounted on the insulating member 101 such that the pads 104 serving as position-setting means precisely fit the mounting holes 102 formed in the insulating member 101, the electronic component 103 is not shaken or removed from its desired mounting position.

Further, when applying heat to the copper cladding 105, the resin coated on the copper cladding 105 is melted, thereby completely covering the entire surface of the electronic component 103 and filling the mounting holes 102. As a result, the electronic component 103 is completely insulated from the air.

Figure 2F:
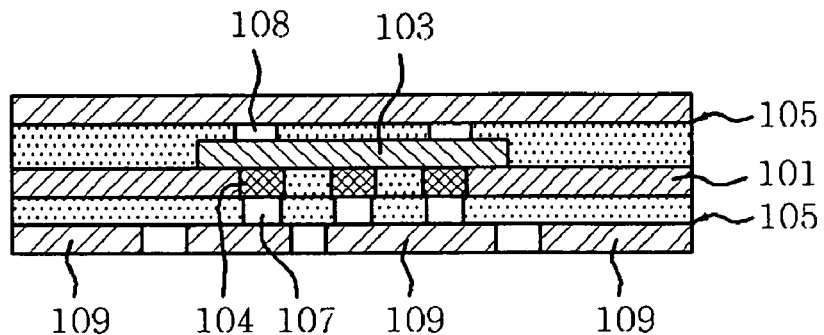

Referring to FIG. 2F, via holes 107 and 108 are formed in the copper cladding 105 to penetrate the copper cladding 105 and the inner surfaces of the via holes 107 and 108 are plated with copper so that the electronic component 103 and the copper cladding 105 are electrically connected to each other via the copper plate formed on the inner surfaces of the via holes 107 and 108. The via-holes 107 and 108 are formed by drilling using a drill, and the large amount of particles and foreign material generated during drilling is removed through a desmear process. The copper plate is formed through a two-step plating process in which a first step of electroless plating is performed to provide conductivity to the inner surfaces of the holes 107 and 108, and a second step of electroplating is performed to form a thick copper film on the inner surfaces of the via holes 107 and 108.

The copper cladding 105 is patterned to form a predetermined pattern 109 using a predetermined process. Since the process of forming the circuit pattern 109 is well known to people skilled in the art, a detailed description of the process is omitted.

A method for manufacturing a circuit board according to another embodiment of the present invention will be described below with reference to FIG. 3 and FIGS. 4A to 4G.

Figure 3:
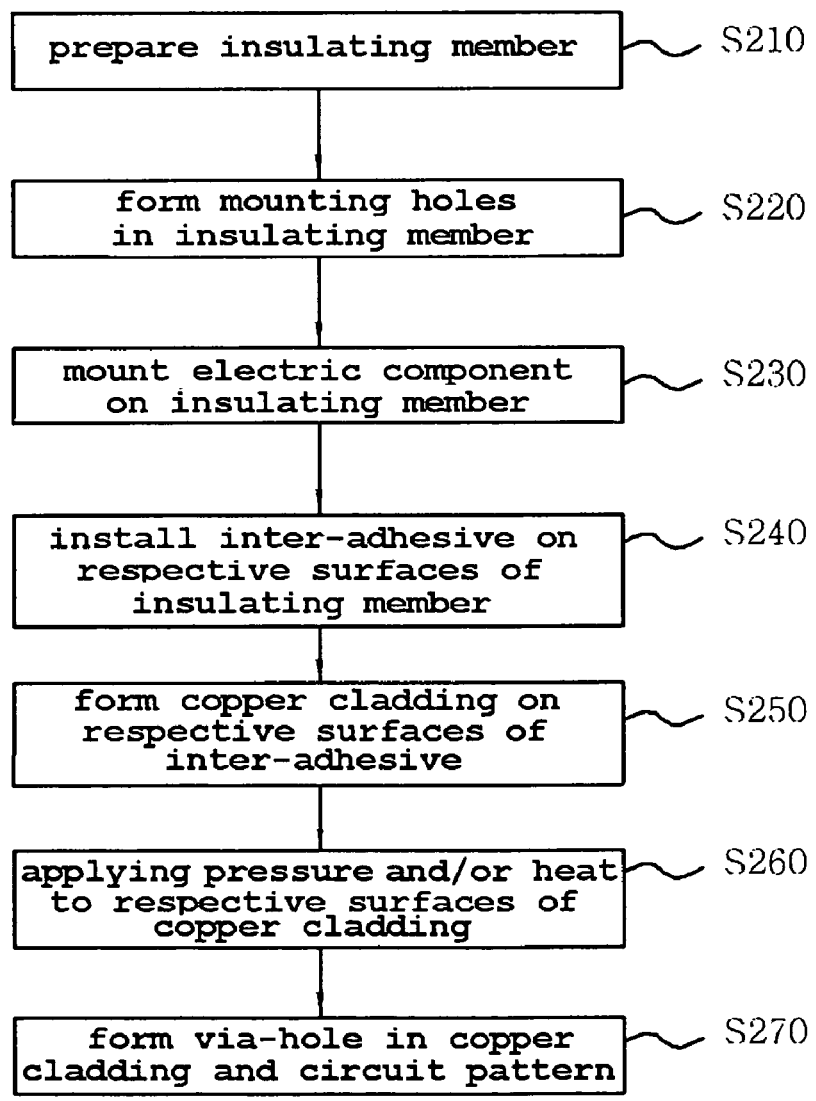
FIG. 3 is a flow chart showing a method for manufacturing a circuit board according to another embodiment of the present invention.

As shown in FIG. 3, the method comprises a step (S210) of preparing an insulating member and an electronic component having a plurality of position-setting means on the lower surface thereof, a step (S220) of forming mounting holes in the insulating member, a step (S230) of mounting the electric component in a manner such that the plurality of position-setting means is received in the mounting holes, a step (S240) of installing inter-adhesive on respective surfaces of the insulating member, a step (S250) of forming copper cladding on respective surfaces of the inter-adhesive, a step (S260) of applying pressure and/or heat to the surfaces of the copper cladding, and a step (S270) of forming via holes in the copper cladding such that the copper cladding is electrically connected to the electronic component, and then forming a circuit pattern using the copper cladding.

The method of manufacturing a circuit board, according to another embodiment of the present invention, will be described in more detail with reference to FIGS. 4A to 4G.

Figure 4A:
FIGS. 4A to 4G are cross-sectional views sequentially showing the method shown in FIG. 3.

First, referring to FIG. 4A, an insulating member 201 is prepared.

Figure 4B:
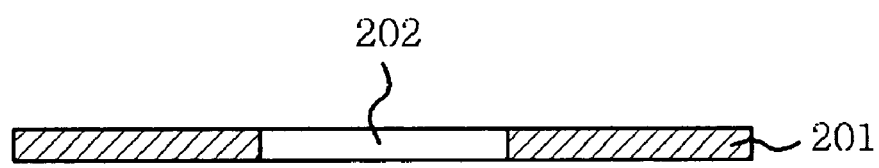

Next, referring to FIG. 4B, holes 202 having a predetermined size are formed in the insulating member 201. The holes 202 serve as mounting holes 202 for mounting an electronic component. The mounting holes 202 are formed in drilling manner using a drill such as an NC drill in which a drilling blade is carefully selected such that the mounting hole 202 has a desired size.

The insulating member 201 is made of prepreg, which is a semi-rigid glass fiber prepared by impregnating glass fibers with resin. According to this embodiment, the insulating member 201 is made of prepreg, but the present invention is not limited thereto. That is, the insulating member can be made of thermo-setting resin or metal core embedded in an insulating material.

Figure 4C:
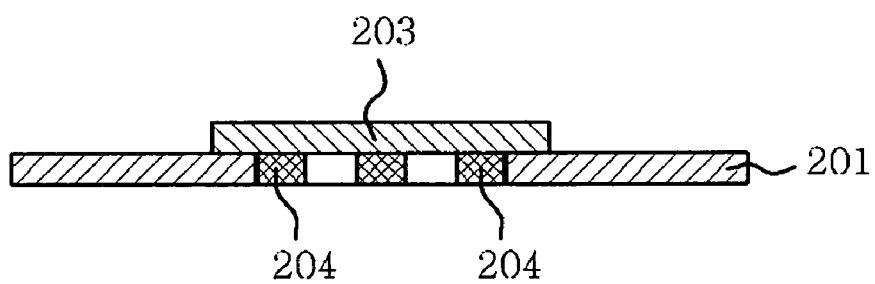

Next, referring to FIG. 4C, an electronic component 203 is mounted on the insulating member 201. In this instance, the electronic component 203 is installed in a manner such that the pads 204 serving as the position-setting means precisely fit respective mounting holes 202.

The number of pads 204 serving as the position-setting means is preferably two or more. According to this embodiment, the electronic component 203 has three pads 204. Further, the pads 204 are electrically connected to the electronic component 203.

Even though the drawing illustrates an electronic component containing a single chip therein, the electronic component can be a stacked chip comprising a plurality of chips stacked in the vertical direction. In this case, an inter-adhesive installed in a subsequent process is a solid adhesive or a highly viscous liquid adhesive, the thickness of the adhesive preferably being equal to the thickness of the electronic component.

Figure 4D:
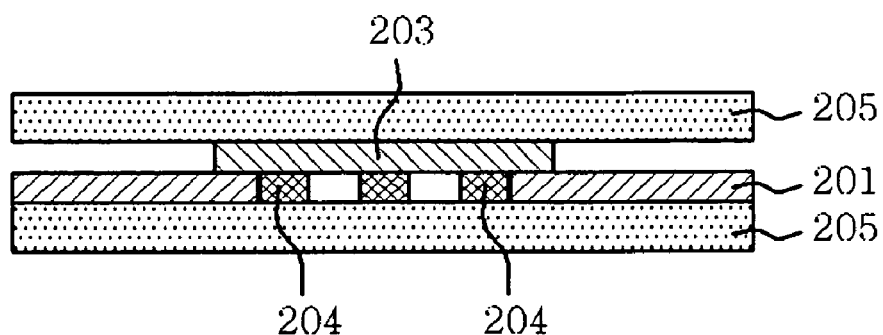

Next, referring to FIG. 4D, the inter-adhesive 205 is applied to respective surfaces of the insulating member 201. That is, an upper inter-adhesive 205 is applied such that it is in contact with the upper surface of the electronic component mounted on the insulating member 201, and a lower inter-adhesive 205 is applied such that it is in contact with the lower surface of the insulating member 201.

The inter-adhesive 205 can be a solid adhesive or a liquid adhesive. According to this embodiment, the inter-adhesive 205 is a prepreg.

Figure 4E:
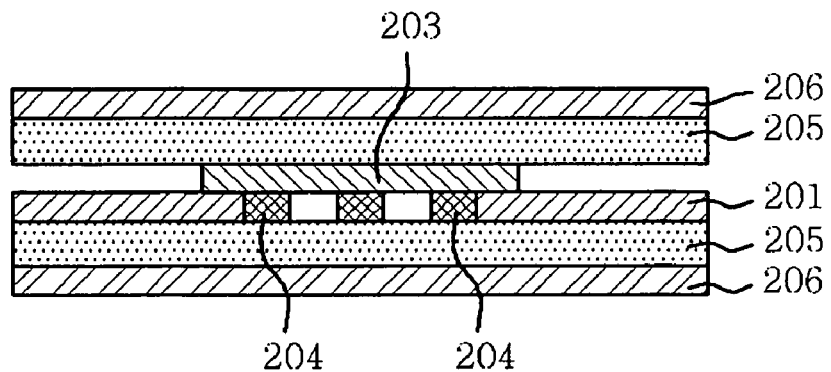

Next, referring to FIG. 4E, upper and lower copper cladding 206 is applied to respective surfaces of the inter-adhesive 205. The copper cladding 206 is made of copper through a rolling mill method and has a thickness of several tens or several hundreds of micrometers.

Figure 4F:
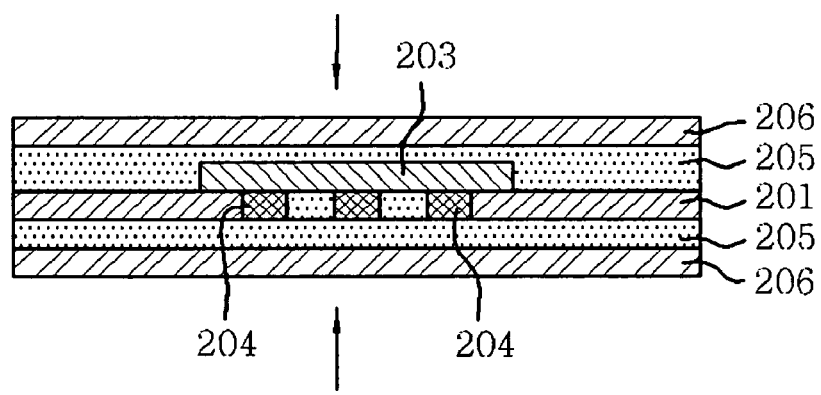

Next, referring to FIG. 4F, the upper copper cladding 206 and the lower copper cladding 206 are pressed in the direction of the arrows using a pressure producing means such as a V-press, and are then heated using a heater.

Thanks to the pressure, the copper cladding 206 is securely attached to the insulating member 201. In this instance, since the inter-adhesive 205 prevents the pressure applied to the copper cladding 206 from being transferred to the electronic component 203, the electronic component 203 is not damaged. Further, since the pads serving as the position-setting means are precisely received in the mounting holes 202, the electronic component 203 is precisely aligned at a desired position on the insulating member 203, and the electronic component 203 is not shaken or removed from its desired position.

Further, when heat is applied to the copper cladding using a heater, the inter-adhesive 205 is melted, thereby completely covering the outer surface of the electronic component 203 and filling the mounting holes 202, so that the electronic component 203 is completely insulated from the air.

Figure 4G:
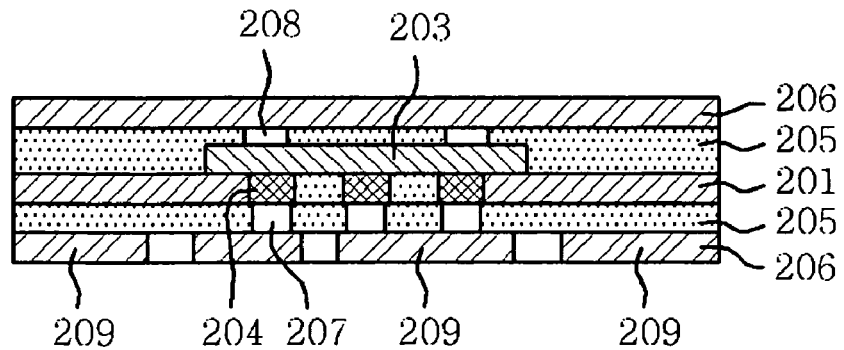

Next, referring to FIG. 4G, via holes 207 and 208 are formed in a manner such that the electronic component 203 and the copper cladding 206 can be electrically connected. That is, a copper plate is formed on the inner surfaces of the via-holes 207 and 208. The via-holes 207 and 208 are formed through drilling, and smear occurring during drilling is removed through a desmear process. The copper plate formed on the inner surfaces of the via holes 207 and 208 is formed through a two-step plating process in which a first plating process is performed through an electroless plating method in order to make the inner surfaces of the via holes 207 and 208 conductive, and a second plating process is performed through an electroplating method in order to form a thick plate layer on each of the inner surfaces of the via holes 207 and 208.

The copper cladding 206 is then patterned to form a desired circuit through well-known processes. The detailed description of the processes for forming the circuit with the copper cladding 206 is omitted because the processes are well known to people skilled in the art.

According to the above-mentioned embodiment, the metal pads soldered to the electronic component are used as the position-setting means, but the position-setting means is not limited thereto. That is, the position-setting means can be made of a plastic material or resin. An example of the position-setting means made of a plastic material or resin is shown in FIG. 5.

Figure 5:
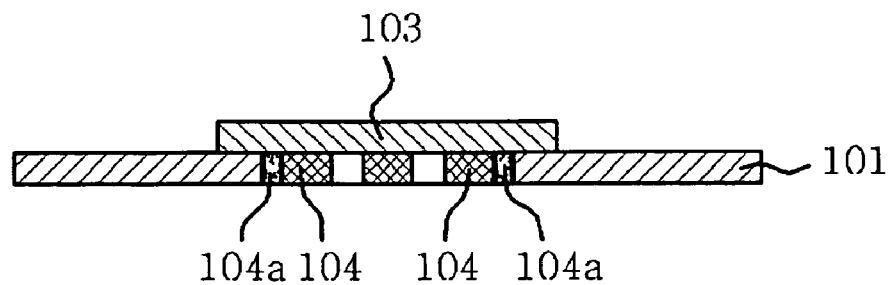
FIG. 5 is a cross-sectional view illustrating a circuit board according to a method for manufacturing a circuit board, according to a modified embodiment of the present invention.
Figure 6A:
FIGS. 6A to 6E are cross-sectional views sequentially illustrating a method for manufacturing a circuit board, according to the conventional art.
Figure 6B:
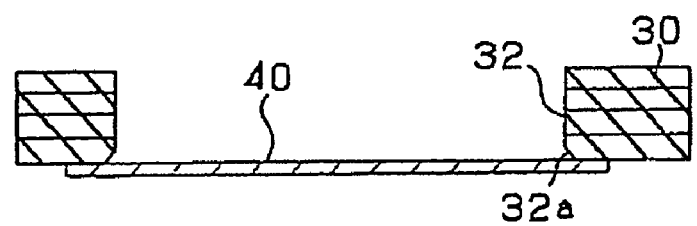
Figure 6C:
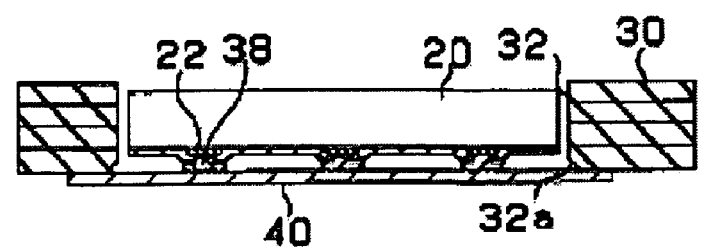
Figure 6D:
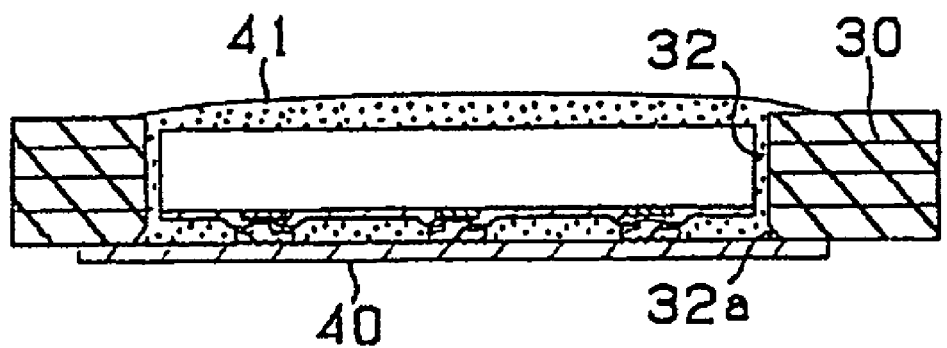
Figure 6E:
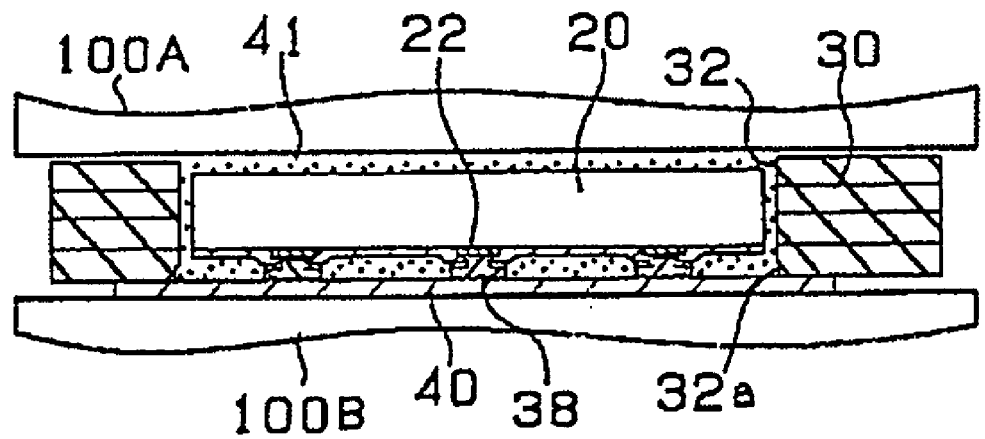

Referring to FIG. 5, an electronic component 103 is mounted on an insulating member 101. Three metal pads 104 electrically connected to the electronic component 103 are formed on the lower surface of the electronic component 103, and protrusions 104a are formed at edge portions of the lower surface of the electronic component 103 in a manner such that the protrusions 104a are received in mounting holes (not shown) formed in the insulating member 101. The protrusions 104a can be made of a plastic material or resin. In the example shown in FIG. 5, the protrusions 104 are made of a plastic material.

According to the above-described method of manufacturing a circuit board, since the electronic component is aligned and fixedly mounted on the insulating member in a manner such that position-setting means provided on the lower surface of the electronic component precisely fit respective mounting holes formed in the insulating member, the electronic component is not shaken or removed from its desired mounting position. Accordingly, the method has the advantage of improving the reliability of circuit boards.

Further, since the entire body of the electronic component is not inserted into mounting holes, but only the position-setting means provided on the lower surface of the electronic component are received in the mounting holes, the mounting holes can be smaller than those of the conventional circuit board. Accordingly, the tolerance of the mounting holes can be decreased.

While the present invention has been shown and described with reference to exemplary embodiments thereof, it will be understood by those having ordinary skill in the art that various changes in form and details may be made therein without departing from the spirit and scope of the present invention as defined by the following claims. Therefore, it is to be understood that the above-described embodiments have been provided only in a descriptive sense and are not to be construed as placing any limitation on the scope of the invention.

What is claimed is:

1. A method for manufacturing a circuit board with a built-in electronic component, comprising:
   (a) step for preparing an insulating member and an electronic component having a plurality of position-setting means on a lower surface thereof;
   (b) step for forming mounting holes corresponding to the position-setting means in the insulating member;
   (c) step for mounting the electronic component on the insulating member to meet the position-setting means and the mounting holes;
   (d) step for applying copper cladding coated with an adhesive on the insulating member to cover the electronic component;
   (e) step for applying heat and/or pressure to the copper cladding; and
   (f) step for forming a via-hole in the copper cladding to electrically connected to the electronic component and for forming a circuit pattern on the copper cladding.

2. A method of manufacturing a circuit board with a built-in electronic component, comprising:
   (a) step for preparing an insulating member and an electronic component having a plurality of position-setting means on a lower surface thereof;
   (b) step for forming mounting holes corresponding to the position-setting means in the insulating member;
   (c) step for mounting the electronic component on the insulating member to meet the position-setting means and the mounting holes;
   (d) step for applying inter-adhesive on both surfaces of the insulating member to cover the electronic component;
   (e) step for installing copper cladding on both surfaces of the inter-adhesive;
   (f) step for applying heat and/or pressure to the copper cladding; and
   (g) step for forming a via-hole in the copper cladding to electrically connected to the electronic component and for forming a circuit pattern on the copper cladding.

3. The method according to claim 2, wherein the inter-adhesive is a prepreg.

4. The method according to claim 2, wherein the inter-adhesive is in a solid phase or a liquid phase.

5. The method according to claim 1 or claim 2, wherein the insulating member is made of resin, prepreg or metal core.

6. The method according to claim 1 or claim 2, wherein the position-setting means are metal pads to be electrically connected to the electronic component.

7. The method according to claim 1 or claim 2, wherein the position-setting means are protrusions to be electrically disconnected from the electronic component.

* * * * *